| United States Patent [19] | [11] | 4,401,545 |
|---|---|---|
| Naarmann et al. | [45] | Aug. 30, 1983 |

[54] ELECTRICALLY CONDUCTIVE POLYPYRROLE DERIVATIVES

[75] Inventors: Herbert Naarmann, Wattenheim; Dieter Naegele, Worms; Klaus Penzien, Frankenthal; Johannes Schlag, Ludwigshafen; Volker Kiener, Weisenheim; Hugo Boehm, Ludwigshafen, all of Fed. Rep. of Germany

[73] Assignee: BASF Aktiengesellschaft, Del.X

[21] Appl. No.: 332,839

[22] Filed: Dec. 21, 1981

[30] Foreign Application Priority Data

Dec. 31, 1980 [DE] Fed. Rep. of Germany ....... 3049551

[51] Int. Cl.$^3$ .......................... C25B 3/02; H01B 1/00; B01J 31/02; H01M 4/60
[52] U.S. Cl. .................................... 204/291; 136/263; 204/59 R; 204/72; 204/78; 252/426; 252/500; 429/42; 429/213; 548/560; 548/563; 548/564
[58] Field of Search ................. 204/59 R, 72, 78, 291; 429/213, 42; 548/560, 563, 564; 252/500

[56] References Cited

U.S. PATENT DOCUMENTS

| 2,874,079 | 2/1959 | Lozier et al. ................. 429/213 X |
| 2,993,946 | 7/1961 | Lozier .......................... 429/213 X |
| 3,274,212 | 9/1966 | Magerlein et al. ............. 252/500 X |
| 3,485,625 | 12/1969 | Fox ................................ 548/560 X |
| 3,574,072 | 4/1971 | Louvar ............................... 204/72 |
| 3,575,889 | 4/1971 | Klopffer et al. ..................... 252/500 |
| 3,808,403 | 4/1974 | Kanaya et al. ..................... 219/529 |
| 4,210,704 | 7/1980 | Chandross et al. ................ 428/414 |

OTHER PUBLICATIONS

Diaz et al., J. Chem. Soc. Chem. Comm. 1979, pp. 635, 636, 7/19/79.
Kanazawa et al., J. Chem. Soc. Chem. Comm. 1979, pp. 854, 855, 10/4/79.
McNeil et al., Australian Journal Chem. 16 (1963), pp. 1056-1075, Bolts et al., pp. 1076-1089, and Bolts et al., pp. 1090-1103.
Diaz et al., American Chemical Society, Organic Coatings and Plastics Chemistry, vol. 43 (1980), pp. 774-776.

Primary Examiner—F. Edmundson
Attorney, Agent, or Firm—Keil & Witherspoon

[57] ABSTRACT

Electrically conductive complexes of polypyrroles with nitroaromatic anions are prepared by polymerizing pyrrole, an N-alkylpyrrole and/or an N-arylpyrrole by anodic oxidation in a polar solvent, in the presence of a salt of an acidic nitroaromatic compound.

4 Claims, No Drawings

ELECTRICALLY CONDUCTIVE POLYPYRROLE DERIVATIVES

The present invention relates to electrically conductive polypyrroles and their preparation by electrochemical polymerization of a pyrrole in the presence of a nitro-containing conductive salt, the film-like material obtained having high electrical conductivity as well as good mechanical properties.

The pyrolysis of tetraiodopyrrole is disclosed by D. E. Weiss et al., Austr. J. Chem. 16 (1963), 1056, 1076 and 1096, and the process results in electrically conductive powders having conductivities of up to $10^{-1}$ $[\Omega^{-1} cm^{-1}]$. The high conductivity can be attributed to complex formation between the insoluble polypyrrole and iodine.

U.S. Pat. No. 3,574,072 describes the electrochemical polymerization of 5-membered heterocyclic compounds, including pyrrole, but no data are given concerning the electrical conductivity and the processability of the pulverulent material obtained.

A. F. Diaz et al., J.C.S. Chem. Comm. 1979, 635, J.C.S. Chem. Comm. 1979, 854 and ACS Org. Coat. Plast. Chem. 43 (1980), disclose that films having electrical conductivities of up to $10^2$ $[\Omega^{-1} cm^{-1}]$ are obtained by the anodic polymerization of pyrrole in the presence of conductive salts. These products are p-conductive polypyrroles, $BF_4^\ominus$, $AsF_6^\ominus$, $ClO_4^\ominus$ and $HSO_4^\ominus$ being mentioned, in particular, as counter-ions. No mechanical data are given for these films.

It is an object of the present invention to provide polymers which have high electrical conductivities as well as good mechanical properties.

We have found that this object is achieved with polypyrrole complexes with nitroaromatic anions.

The complex consists of a polypyrrole cation and a nitroaromatic anion and is prepared according to the invention by the anodic oxidation of a pyrrole in a polar solvent, in the presence of a salt of an acidic nitroaromatic compound.

Pyrrole, an N-alkylpyrrole or an N-arylpyrrole is employed as the monomer. Preferred members of the N-arylpyrrole series are N-phenylpyrrole and N-phenylpyrroles which are substituted in the nucleus by non-reactive 2nd order substituents, for example nitrophenylpyrroles. The monomer concentration is in general 0.1 mole per liter of solvent, but since in most cases the electrolysis is carried out only to low conversions, the concentration can also be substantially less or greater than this.

The novel conductive salts are nitroaromatic compounds which have acidic groups. These include nitrophenols, nitroaromatic carboxylic acids and nitroaromatic sulfonic acids, in particular nitro-, dinitro- and tri-nitro-phenols, nitro-, dinitro- and trinitro-benzoic acids and nitro-, dinitro- and trinitro-benzenesulfonic acids. Nitroaromatic compounds with several acidic groups, for example phenolic hydroxyl groups, carboxyl groups and sulfonic acid groups, are also suitable. The fused nitroaromatics which have acidic groups and are known as dye precursors can also be employed. Acidic aromatic compounds which have nitroso groups are also suitable. The conductive salt concentration is from 0.001 to 1, preferably from 0.01 to 0.1, mole per liter.

The preparation of the novel polypyrrole complexes is preferably carried out using a simple electrolysis apparatus comprising a cell without a diaphragm and two noble metal electrodes, preferably platinum electrodes. At least the anode must be sheet-like, the films being deposited on this anode during electrolysis. Examples of other suitable electrolysis apparatuses are cells with diaphragms or those with reference electrodes for exact determination of potential. An advantageous method of monitoring the thickness of film deposited is to measure the amount of electricity (Amp.sec).

The electrolysis is preferably carried out in a polar organic solvent which dissolves pyrrole and the conductive salt. Water can be added to increase the electrical conductivity if a water-miscible organic solvent is used. Alcohols, ethers, eg. dioxane or 1,2-dimethoxyethane, glacial acetic acid, acetone, dimethylformamide or N-methylpyrrolidone are preferred solvents.

The electrolysis is normally carried out at room temperature and under an inert gas. In the experiments with pyrrole as the monomer, the reaction temperature proved not to be critical provided that it does not fall below the solidification point, or exceed the boiling point, of the electrolyte.

The film deposited on the anode during the electrolysis of a pyrrole derivative in the presence of a conductive salt containing nitro groups is washed with a solvent to remove adhering conductive salt and is dried at from 50° to 150° C. The film can then easily be detached from the electrode, particularly if the layer deposited is more than 50 μm thick.

To measure the ultimate tensile strength, film strips of specific dimensions (clamped length 25 mm, measurement length 10 mm, width 4 mm) are stretched to breaking on an INSTRON 1112 machine, according to DIN 53,504. The films undergo only insignificant elongation.

The electrical conductivity in $[\Omega^{-1} cm^{-1}]$ is determined by contacting the films with conductive silver and carrying out the measurement according to the two-point method. Identical results are obtained according to the four-point method, where it is not possible for the contact resistance to have an effect. No contribution from ionic conduction to the current flow was detected.

The novel polypyrrole complexes which have high electrical conductivity and good mechanical properties can be used for producing electrodes, catalysts, batteries, switches, semi-conductor components, solar cells and antistatic finishes for plastics. They result in an advance in the art particularly in these cases where good mechanical properties of the components are important.

EXAMPLE 1

120 ml of acetonitrile, 0.48 g of pyrrole and 0.39 g of tributylammonium m-nitrobenzenesulfonate are introduced into a glass vessel. Two platinum electrodes, each have a surface area of 14 cm², are introduced, at a distance of 4 cm part, into the solution, and the latter is stirred whilst 140 Amp.sec are allowed to flow. A black film is deposited on the anode. The film can be detached from the platinum after the coated anode has been rinsed with acetonitrile and dried at 60° C.

Properties of the film:

Tensile strength: 51 N/mm²
Electrical conductivity: 80 $\Omega^{-1}$.cm$^{-1}$
Thickness: 78 μm
Sulfur content: 8.6%

EXAMPLE 2

The procedure of Example 1 is followed, but tributylammonium 2,6-dinitrophenol-4-sulfonate is employed as the conductive salt.

Properties of the film:

Tensile strength: 60 N/mm$^2$
Electrical conductivity: 43 $\Omega^{-1}$·cm$^{-1}$
Thickness: 58 μm
Sulfur content: 7.8%

EXAMPLE 3

120 ml of acetonitrile, 0.48 g of pyrrole, 1.4 g of 2-nitrophenol and 1.85 g of tributylamine are stirred in a glass vessel. When the procedure of Example 1 is followed, a film having the following properties is obtained:

Tensile strength: 41 N/mm$^2$
Electrical conductivity: 21 $\Omega^{-1}$·cm$^{-1}$
Thickness: 62 μm
Oxygen content: 12%

EXAMPLE 4

120 ml of acetonitrile, 0.48 g of pyrrole, 1.23 g of 2-hydroxy-3,5-dinitrobenzoic acid and 0.93 g of tributylamine are stirred in a glass vessel. When the procedure of Example 1 is followed, a film having the following properties is obtained:

Tensile strength: 35 N/mm$^2$
Electrical conductivity: 33 $\Omega^{-1}$·cm$^{-1}$
Thickness: 57 μm
Oxygen content: 22%

EXAMPLE 5

120 ml of acetonitrile, 0.56 g of N-methylpyrrole and 0.39 g of tributylammonium m-nitrobenzenesulfonate are stirred under argon in a glass vessel. When the procedure of Example 1 is followed, but with 80 Amp.sec, a film having the following properties is obtained:

Tensile strength: 19 N/mm$^2$
Electrical conductivity: 16 $\Omega^{-1}$·cm$^{-1}$
Thickness: 61 μm
Sulfur content: 6.3%

EXAMPLE 6

120 ml of acetonitrile, 0.61 g of N-(2-nitrophenyl)-pyrrole and 0.45 g of tributylammonium m-nitrobenzenesulfonate are stirred under argon in a glass vessel. When the procedure of Example 1 is followed, a film having the following properties is obtained:

Tensile strength: 20 N/mm$^2$
Electrical conductivity: 14 $\Omega^{-1}$·cm$^{-1}$
Thickness: 65 μm
Sulfur content: 5.4%

COMPARATIVE EXPERIMENTS

A 120 ml of acetonitrile, 0.84 ml of water, 0.48 g of pyrrole and 0.8 g of tetramethylammonium tetrafluoroborate are stirred in a glass vessel. When 100 Amp.sec are passed through the electrolyte and otherwise the procedure of Example 1 is followed, a film having the following properties is obtained:

Tensile strength: 3.0 N/mm$^2$
Electrical conductivity: 15 $\Omega^{-1}$·cm$^{-1}$
Thickness: 55 μm
Fluorine content: 21.7%

B 120 ml of acetonitrile, 0.84 ml of water, 0.48 g of pyrrole and 1.18 g of concentrated sulfuric acid are stirred in a glass vessel. When 100 Amp.sec are passed through the electrolyte and otherwise the procedure of Example 1 is followed, a film having the following properties is obtained:

Tensile strength: 15 N/mm$^2$
Electrical conductivity: 7 $\Omega^{-1}$·cm$^{-1}$
Thickness: 20 μm
Sulfur content: 9.3%

C 120 ml of acetonitrile, 0.84 ml of water, 0.48 g of pyrrole and 1.15 g of K(AsF$_6$) are stirred in a glass vessel. When 100 Amp.sec are passed through the electrolyte and otherwise the procedure of Example 1 is followed, a film having the following properties is obtained:

Tensile strength: 18 N/mm$^2$
Electrical conductivity: 50 $\Omega^{-1}$·cm$^{-1}$
Thickness: 32 μm
Fluorine content: 25.3%

We claim:

1. An electrically conductive complex of a polypyrrole with a nitroaromatic anion.

2. An electrically conductive complex as claimed in claim 1, whose polypyrrole component is based on pyrrole, an N-alkylpyrrole and/or an N-arylpyrrole.

3. An electrically conductive complex as claimed in claim 1, whose nitroaromatic anion component is based on nitrophenol, a nitroaromatic carboxylic acid and/or a nitroaromatic sulfonic acid.

4. A film composed of the electrically conductive complex as claimed in claim 1.

* * * * *